(12) United States Patent
Malik

(10) Patent No.: US 8,394,729 B2
(45) Date of Patent: Mar. 12, 2013

(54) INCREASING THE SEEBECK COEFFICIENT OF SEMICONDUCTORS BY HPHT SINTERING

(75) Inventor: Abds-Sami Malik, Westerville, OH (US)

(73) Assignee: Diamond Innovations, Inc., Worthington, OH (US)

( * ) Notice: Subject to any disclaimer, the term of this patent is extended or adjusted under 35 U.S.C. 154(b) by 241 days.

(21) Appl. No.: 12/306,431

(22) PCT Filed: Jun. 26, 2007

(86) PCT No.: PCT/US2007/072115
§ 371 (c)(1),
(2), (4) Date: Dec. 23, 2008

(87) PCT Pub. No.: WO2008/002910
PCT Pub. Date: Jan. 3, 2008

(65) Prior Publication Data
US 2009/0272416 A1 Nov. 5, 2009

Related U.S. Application Data

(60) Provisional application No. 60/805,805, filed on Jun. 26, 2006.

(51) Int. Cl.
*H01L 21/00* (2006.01)
*H01L 21/06* (2006.01)
(52) U.S. Cl. .......... 438/797; 438/102; 257/E51.012
(58) Field of Classification Search .......... 438/102, 438/795, 799
See application file for complete search history.

(56) References Cited

U.S. PATENT DOCUMENTS
2006/0053969 A1* 3/2006 Harada et al. .......... 75/255

FOREIGN PATENT DOCUMENTS
JP 2002-353527 6/2002
WO 2008/002910 1/2008

OTHER PUBLICATIONS

Su, T., Zhu, P., Ma, H., Ren, G., Guo, J., Imai, Y., & Jia, X. (2006). Electrical transport and thermoelectric properties of PbTe doped with Sb2Te3 prepared by high-pressure and high-temperature. Journal of Alloys and Compounds, 422(2006), 328-331.*
Zhu, P Jia, X Chen, H., Chen, L., Li, D., Guo, W., Ma, H., Ren, G., & Zuo, G. (2002). PbTe syntheses by high pressure and high temperature approach. Chinese Journal of High Physics, 16(3), 1-6.*
Zhu, Pin-wen et al., "PbTe Syntheses by High Pressure and High Temperature Approach", Chinese Journal of High Physics, vol. 16, No. 3, Sep. 2002.
Kishimoto et al., "Preparation of sintered degenerate n-type PbTe with a small grain size and its thermoelectric properties", Journal of Applied Physics, Sep. 1, 2002, 2544-2549, vol. 92, No. 5, American Institute of Physics.
Zhu, et al., "Giant improved thermoelectric properties in PbTe by HPHT at room temperature", Chemical Physics Letters, vol. 359 (2002) pp. 89-94.

(Continued)

*Primary Examiner* — Charles Garber
*Assistant Examiner* — Calvin Choi
(74) *Attorney, Agent, or Firm* — Frank Gao; Maria Gasaway

(57) ABSTRACT

A method for increasing the Seebeck coefficient of a semiconductor involves creating a reaction cell including a semiconductor in a pressure-transmitting medium, exposing the reaction cell to elevated pressure and elevated temperature for a time sufficient to increase the Seebeck coefficient of the semiconductor, and recovering the semiconductor with an increased Seebeck coefficient.

21 Claims, 2 Drawing Sheets

OTHER PUBLICATIONS

Taichao et al., "Electrical transport and thermoelectric properties of PbTe doped with Sb2Te3 prepared by high-pressure and high-temperature", Journal of Alloys and Compounds, vol. 422 (2006) pp. 328-331.

Zhu, P.W. et al., "A new method of synthesis for thermoelectric materials: HPHT" Solid State Communications, Oxford, vol. 123, Jan. 1, 2002, pp. 43-47.

Su T. et al., "Electrical transport and thermoelectric properties of PbTe doped with Sb2Te3 prepared by high-pressure and high-temperature", Journal of Alloys and Compounds, Elsevier Sequioa, Lausanne, CH, vol. 422, No. 1-2 (Sep. 28, 2006), pp. 328-331.

Ovsyannikov Sergey et al., "Pressure-tuned colossal improvement of thermoelectric efficient of PbTe" Applied Physics Letters, AIP, American Institute of Physics, Melville, NY, US, vol. 90, No. 12, Mar. 19, 2007, pp. 122103-1222103.

Su T. et al., Thermoelectric properties of nonstoichiometric PbTe prepared by HPHT, Journal of Alloys and Compounds, Elsevier Sequoia, Lausanne, CH., vol. 468, No. 1-2, Jan. 22, 2009, pp. 410-413.

Schhennikov V V et al: "Thermopower of lead chalcogenides at high pressures", Physics of the Solid State, Naukat/Interperiodica, MO., vol. 44, No. 10, Oct. 1, 2002, pp. 1845-1849.

Polvani D A et al: "Large improvement in thermoelectric properties in pressure-tuned p-type Sb1.5BioTe3", Database accession No. 7532638; & Chemistry of Materials American Chem. Soc. USA, vol. 13, No. 6, pp. 2068-2071.

Meng J F et al: "Multifold enhancement of the thermoelectric figure of merit in p-type BaBiTe3 by pressure tuning", Journal of Applied Physics, American Institute of Physics, New York, US, vol. 90, No. 6, Sep. 15, 2001, p. 2836-2839.

Su, T., Jia, X., Ma, H., Zhou, L., Guo, J., Dong, N., (2007). Enhanced power factor of Ag0.208Sb0.275Te0.517 prepared by HPHT. Physics Letters A 372 (2008) 515-518.

Ma, H., Su., T., Zhu, P., Guo, J., Jia, X. (2007). Preparation and transport properties of AgSbTe2 by high-pressure and high-temperature. Journal of Alloys and Compounds 454 (2008) 415-418.

Hsu, K. F., Loo, S., Guo, F., Chen, W., Dyck, J., Uher, C., Hogan, T., Polychroniadis, E.K., Kanatzidis, M. (2004). Cubic AgPbmSbTe2+m: Bulk thermoelectric materials with high figure of merit. Science vol. 303, (2004) 818-821.

Zhu, Pinwen et al: "Electrical Transport and Thermoelectric Properties of PbTe Prepared by HPHT", Materials Transactions, vol. 45, No. 11 (2004) pp. 3102 to 3105.

* cited by examiner

INCREASING THE SEEBECK COEFFICIENT OF SEMICONDUCTORS BY HPHT SINTERING

CROSS-REFERENCE TO RELATED APPLICATIONS

This patent application claims priority to U.S. provisional patent application No. 60/805,805 filed on Jun. 26, 2006, entitled "Increasing the Seebeck Coefficient of Semiconductors by HP/HT Sintering," the disclosure of which is incorporated herein by reference in its entirety.

STATEMENT REGARDING FEDERAL SPONSORED RESEARCH

Not Applicable.

JOINT RESEARCH AGREEMENT

Not Applicable.

INCORPORATION BY REFERENCE OF MATERIAL ON DISC

Not Applicable.

BACKGROUND

The Seebeck effect, or the thermoelectric effect, is the voltage difference that exists between two points of a material when a temperature gradient is established between those points. Materials, usually semiconductors or conductors which exhibit this phenomenon, are known as thermoelectrics or thermoelectric materials. Devices made from thermoelectric materials take advantage of the Seebeck effect to convert heat into electricity. For instance, the Seebeck effect is the physical basis for a thermocouple, which is often used in temperature measurement.

Measurements of the Seebeck effect are reported as the Seebeck coefficient ($\alpha$) in units of $\mu V/K$ (microvolts per Kelvin). The Seebeck coefficient can be defined as the ratio between the open circuit voltage and the temperature difference between two points on a conductor, when a temperature difference exists between those points. The Seebeck coefficient can take either positive or negative values depending upon whether the charge carriers are holes or electrons. The Seebeck coefficient is often referred to as the thermoelectric power or thermopower.

Good thermoelectric materials should possess Seebeck coefficients with large absolute values, high electrical conductivity ($\sigma$, in units of $\Omega$ cm), and low thermal conductivity ($\lambda$, in units of W/cm K). A high electrical conductivity results in minimizing Joule heating in the thermoelectric material, while a low thermal conductivity helps to maintain large temperature gradients in the material.

The efficiency of a thermoelectric material is, therefore, described by the thermoelectric figure-of-merit (Z, in units of $K^{-1}$), which is calculated by the relationship:

$$Z = \frac{\alpha^2 \sigma}{\lambda}.$$

A useful dimensionless figure-of-merit is defined as ZT, where T is temperature (in K), and $$ZT = \frac{\alpha^2 \sigma T}{\lambda}.$$

Metals and metal alloys received much interest in the early development of thermoelectric applications, but these materials have a high thermal conductivity. Furthermore, the Seebeck coefficient of most metals is on the order of 10 $\mu V/K$, or less. Semiconductors were found with Seebeck coefficients greater than 100 $\mu V/K$. Generally, semiconductors also possess high electrical conductivity and low thermal conductivity, which further increases Z, and thus increases the efficiency of the thermoelectric material.

For instance, bismuth telluride ($Bi_2Te_3$) and lead telluride (PbTe) are two commonly used semiconductor thermoelectric materials with optimized Seebeck coefficients greater than 200 $\mu V/K$.

Optimizing the Seebeck coefficient of a material generally involves synthetic methods by which the stoichiometry of the starting material is slightly altered with a dopant material. Often, this leads to a material with an entirely different composition. In addition, there is no easy way to predict the Seebeck coefficient of a specific material composition.

Accordingly, there remains a need for materials with Seebeck coefficients with large absolute values. In addition, there remains a need for a method to increase the Seebeck coefficient of a material that does not necessarily involve adding dopants to the material. Embodiments herein address these and other needs.

SUMMARY

A method of increasing the Seebeck coefficient of a semiconductor includes exposing a semiconductor to elevated pressure and elevated temperature for a time sufficient to increase the Seebeck coefficient of the semiconductor when measured at the pressure of use, and recovering the semiconductor.

In embodiments, the elevated pressure may range from about 1 GPa to 20 GPa and the elevated temperature may range from about the sintering temperature to about 500° C. above the melting point of the semiconductor at process pressures, for example, about 500° C. to about 2500° C. In still other embodiments, the pressure may range from about 2 GPa to about 10 GPa. In still other embodiments, the pressure may range from about 4 GPa to about 8 GPa, and preferably about 5 GPa.

In exemplary embodiments, the temperature may range from about the sintering temperature to about 500° C. above the melting point of the semiconductor at process pressures. In other embodiments, the temperature may range from about 900° C. to about the melting point of the semiconductor at the process pressures. Alternatively, the temperature may range from a sintering temperature to about the melting point of the semiconductor at process pressures.

A semiconductor is a solid material having an electrical conductivity that is between that of a conductor and an insulator, and through which conduction usually takes place by means of holes and electrons. The properties of a semiconductor typically vary with temperature so that their conductivity rises as temperature decreases. In exemplary embodiments, the semiconductor may be selenides, antimonides, tellurides, sulfides, germanium compounds, and mixtures thereof. Dopants may be added and may include, for example, Br, Cl, I, Ga, In, Na, K, Ag, or other intentional impurities to change the electrical or thermal conductivity of the base material. In still other embodiments, the semiconductor may be lead selenide, lead sulfide, lead telluride, tin sulfide, tin telluride, and mixtures thereof. In an exemplary embodiment, the semiconductor is lead telluride.

In embodiments, a time sufficient to increase the Seebeck coefficient of a semiconductor may range from about 30 seconds to about 24 hours. In yet another embodiment, the time may be from about 5 minutes to about 30 minutes. In still another embodiment, the time may be about 5 minutes to about 15 minutes.

In an exemplary embodiment, the semiconductor may include a semiconductor starting powder, where the semiconductor starting powder has an average grain size of about 50 μm to about 4000 μm. In other embodiments, the semiconductor may be a polycrystalline mass or one or more discrete single crystals.

Another exemplary method may include increasing the Seebeck coefficient of lead telluride. The method may include exposing the lead telluride to a pressure ranging from about 4 GPa to about 8 GPa and a temperature from about 600° C. to about 1300° C. for a time sufficient to increase the Seebeck coefficient of the lead telluride when measured at the pressure of use, and recovering the lead telluride. In embodiments, a time sufficient to increase the Seebeck coefficient of lead telluride may be about 5 minutes to about 24 hours.

Another embodiment may include a high pressure, high temperature ("HPHT")-treated high purity semiconductor material having a Seebeck coefficient that is higher than a semiconductor material of the same composition that is not HPHT-treated. In embodiments, the semiconductor material with a Seebeck coefficient that is higher than a semiconductor material of the same composition that is not HPHT-treated may be selenides, antimonides, tellurides, sulfides, germanium compounds, and mixtures thereof. In other embodiments, the material may be lead selenide, lead sulfide, lead telluride, tin sulfide, tin telluride, and mixtures thereof. In still other embodiments the semiconductor material may be lead telluride.

DETAILED DESCRIPTION

Before the present methods, systems, and materials are described, it is to be understood that this disclosure is not limited to the particular methodologies, systems, and materials described, as these may vary. It is also to be understood that the terminology used in the description is for the purpose of describing the particular versions or embodiments only, and is not intended to limit the scope.

It must also be noted that as used herein and in the appended claims, the singular forms "a," "an," and "the" include plural references unless the context clearly dictates otherwise. Unless defined otherwise, all technical and scientific terms used herein have the same meanings as commonly understood by one of ordinary skill in the art. As used herein, the word "comprising" means "including, but not limited to." Although any methods, materials, and devices similar or equivalent to those described herein can be used in the practice or testing of embodiments, the preferred methods, materials, and devices are now described. All publications mentioned herein are incorporated by reference. Nothing herein is to be construed as an admission that the embodiments described herein are not entitled to antedate such disclosure by virtue of prior invention.

The present embodiments are illustrated in connection with a conventional high pressure, high temperature ("HPHT") apparatus which may be of the belt- or die-type described, for example, in U.S. Pat. Nos. 2,947,611; 2,941,241; 2,941,248; 3,609,818; 3,767,371; 4,289,503; 4,673,414; and 4,954,139; each of which is incorporated herein in its entirety. However, it will be appreciated that the method of the present invention will find applicability in any HPHT apparatus which is capable of providing the required high pressure and high temperature conditions simultaneously. Accordingly, it is intended that such other HPHT devices are within the scope of the invention herein described.

Figure 1:
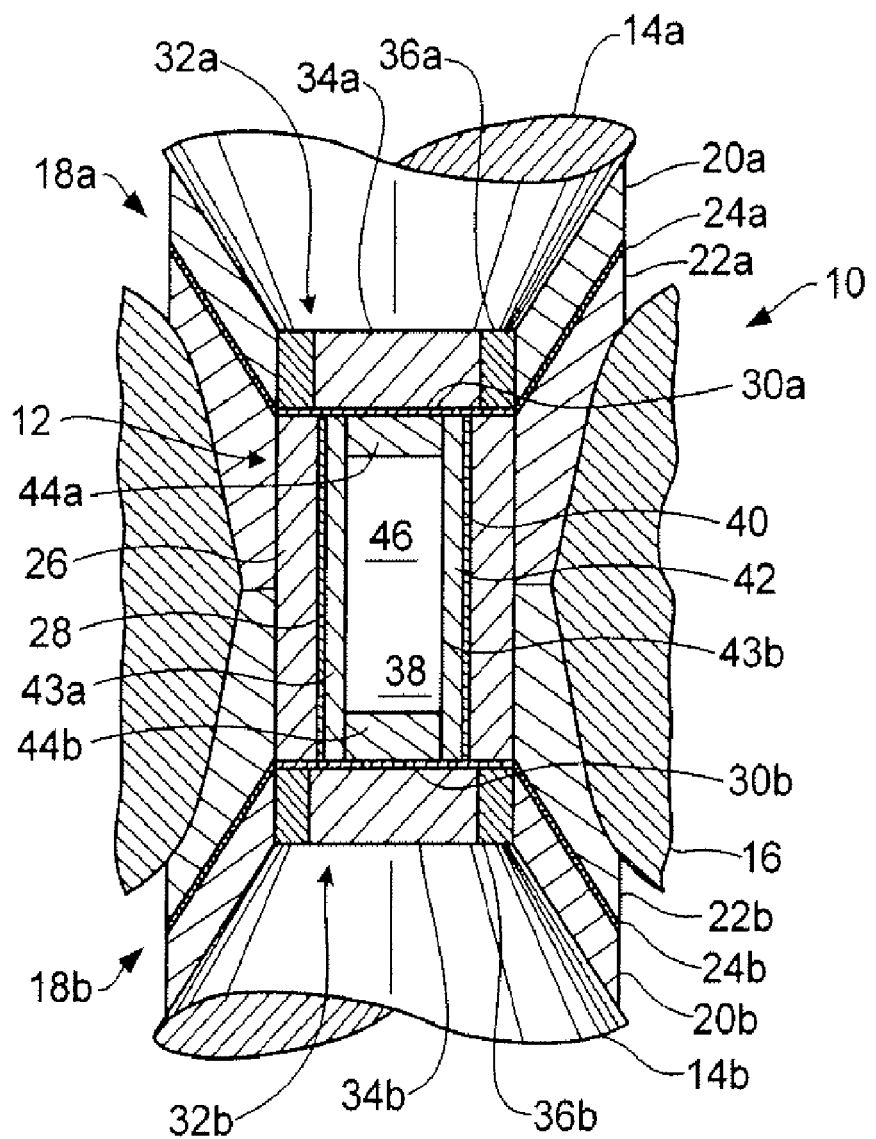
FIG. 1 is a cross-sectional view of an exemplary HPHT apparatus which may be utilized to increase the Seebeck coefficient in a semiconductor.
Figure 2:
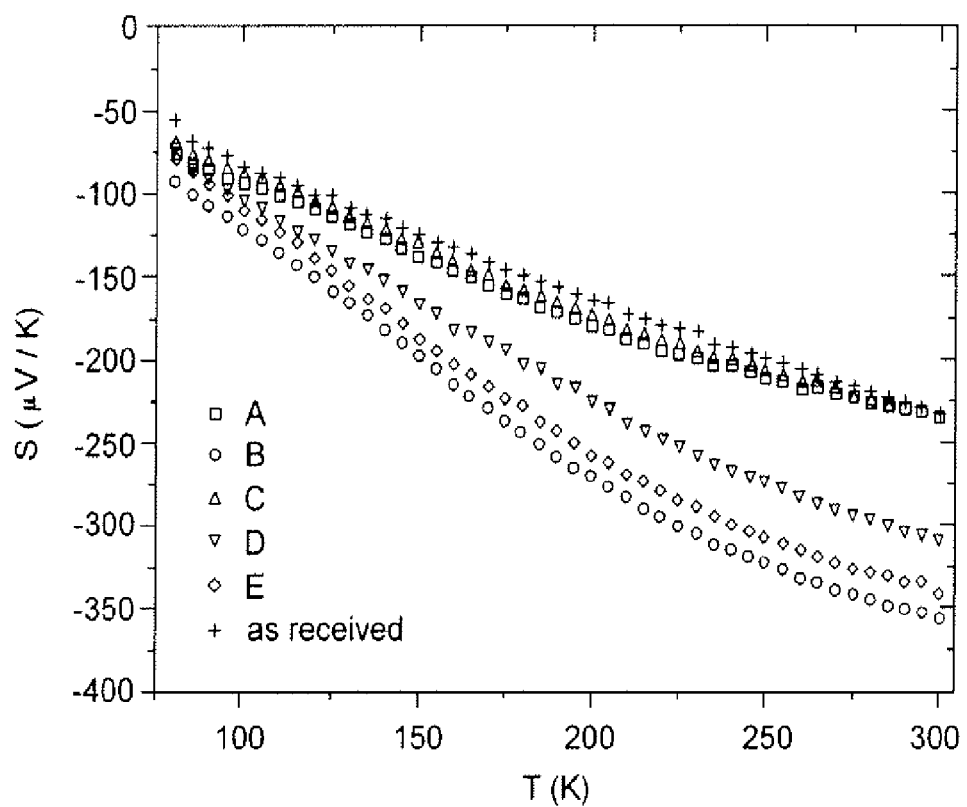
FIG. 2 is a graph of Seebeck coefficient versus temperature for untreated and HPHT treated lead telluride.

Looking then to FIGS. 1 and 2, an illustrative HPHT apparatus is shown generally at 10 to include a generally cylindrical reaction cell assembly 12 interposed between a pair of punches, 14a and 14b, and surrounded by a generally annular belt or die member 16. Preferably, both punches 14 and belt member 16 are formed of a relatively hard material, such as cemented tungsten carbide. Between punches 14 and belt member 16 are a pair of insulating assemblies, 18a and 18b, each of which is formed of a pair of thermally and electrically insulating members, 20a-b and 22a-b, in some, embodiments formed of pyrophyllite or the like, and having an intermediate metallic or other gasket, 24a and 24b, disposed there between.

As shown, reaction cell assembly 12 includes a hollow cylinder 26 which may be formed of a material, such as salt or the like, which is converted during HPHT by phase transformation or compaction to a stronger, stiffer state or, alternatively, of a talc material or the like, which is not so converted. In either case, the material of cylinder 26 is selected as being substantially free of volume discontinuities or the like, under HPHT as may occur, for example, with pyrophyllite or alumina materials. Materials meeting such criteria are described in U.S. Pat. No. 3,030,662, which is incorporated herein in its entirety.

Positioned within salt cylinder 26 is one or more adjacent cylinders, each of which is provided as a graphite electrical resistance heater tube 28. Electrical connection with heater tube 28 is achieved via an adjacent pair of conductive metal end discs, 30a and 30b, which are axially-disposed with respect to heater tube 28. Adjacent each disc 30 is provided an end cap assembly, shown generally at 32a and 32b, each of which includes an insulating plug, 34a and 34b, surrounded by an electrically conductive ring, 36a and 36b.

It will be appreciated that the interior of heater 28, along with end discs 30, salt cylinder 26, and end cap assemblies 32, defines a generally-cylindrical inner chamber, shown at 38, having defined axial and radial extents and containing a pressure-transmitting medium 46. Pressure-transmitting medium 46 is selected as having a relatively low coefficient of internal friction to make it semi-fluid at HPHT conditions, and it may be provided as or within a cylindrical salt liner 42, which defines radial pressure-transmitting medium layers 43a and 43b and is fitted with an axial pair of salt plugs, 44a and 44b, each of which defines an axial pressure transmitting medium layer. In some embodiments, pressure-transmitting medium 46, salt liner 42 and/or plugs 44 may be formed of a graphite material or of sodium chloride, but they also may be formed of any chloride, iodide, or bromide of sodium, potassium, or calcium or a mixture thereof. Alternatively, pressure-transmitting medium 46 may be provided in powdered or particulate form. In either case, medium 46 defines a cavity space which is configured to receive the semiconductor material for HPHT processing with conditions sufficient to increase the Seebeck coefficient after recovery from the HPHT processing.

In an embodiment, a method for increasing the Seebeck coefficient of a semiconductor includes creating a reaction cell with a semiconductor which is exposed to elevated pressure and elevated temperature for a time sufficient to increase the Seebeck coefficient of the semiconductor. The semiconductor with increased Seebeck coefficient is then recovered from the reaction cell. In an embodiment, the semiconductor 51 is shaped into a pellet before it is placed in a reaction cell.

In an embodiment for increasing the Seebeck coefficient of a semiconductor, the pressure ranges from about 1 GPa to 20 GPa and the temperature ranges from about the sintering temperature to about 500° C. above the melting point of the semiconductor at process pressures. In another embodiment, the pressure ranges from about 2 GPa to about 10 GPa. In yet another embodiment, the pressure ranges from about 4 GPa to about 8 GPa. In still another embodiment, the pressure is about 5 GPa.

The temperature ranges of an embodiment may be from about the temperature at which the semiconductor material sinters together to about the melting point of the semiconductor at process pressures, or alternatively, from the sintering temperature to about 500° C. above the melting point of the semiconductor at process pressures. This may be about 600° C. to about 1300° C. In still another embodiment, the temperature ranges from about 700° C. to about 900° C. Alternatively, the temperature ranges from about 900° C. to about the melting point of the semiconductor at the process pressures. In some embodiments, a preferred temperature range may be +/−400° C. from the melting point of the semiconductor under elevated pressure.

For an embodiment of a method to increase and maintain for a period of time the Seebeck coefficient of a semiconductor, the semiconductor material may include lead selenide, lead sulfide, lead telluride (PbTe), tin sulfide, tin telluride, lead tin telluride, thallium tin telluride, thallium germanium telluride, and/or mixtures thereof. Any neat, pure, or doped semiconductor material or compound, including mixtures thereof, which results in increased Seebeck coefficient when subjected to the HPHT treatments or HPHT sintering conditions described and claimed herein, are within the scope of the instant claims. For example, dopants may be added and may include, for example, Br, Cl, I, Ga, In, Na, K, Ag, or other intentional impurities to change the electrical or thermal conductivity of the base material.

The embodiments described herein relating to PbTe consider improving the Seebeck coefficient of already-created PbTe after HPHT conditions that may have created it have been removed, and not continued processing of elemental Pb and Te. The PbTe that is to be improved may be made by non-HPHT methods or HPHT methods. Exemplary methods of synthesizing PbTe for use in the embodiments described herein include mixing or combining elemental Pb and elemental Te in a processing device, and heating the mixture to approximately 900° C. to about 1000° C. under non-elevated pressure (i.e., a pressure that does not substantially vary from atmospheric pressure as compared to the HPHT conditions described above), so that the mixture melts and reacts to form PbTe. Other methods of forming PbTe are possible. The formed PbTe may then be cooled and subsequently subjected to the HPHT conditions described herein in order to improve its Seebeck coefficient.

In one embodiment of a method to increase the Seebeck coefficient of a semiconductor, a semiconductor material is exposed to HPHT treatments described herein for about 30 seconds or longer, up to about 24 hours. In another embodiment, the semiconductor material may be exposed to HPHT treatments for about 30 seconds to about 15 minutes. In still another embodiment, the semiconductor material may be exposed to HPHT treatments for about 5 minutes to about 30 minutes, preferably 1.5 minutes.

In yet another embodiment, a method for increasing the Seebeck coefficient of the semiconductor lead telluride includes creating a reaction cell with the lead telluride, exposing the reaction cell to a pressure ranging from about 4 GPa to about 6 GPa and a temperature from about 700° C. to about 900° C. for a time sufficient to increase the Seebeck coefficient of the lead telluride, and recovering the lead telluride with the increased Seebeck coefficient.

In one embodiment, the lead telluride is exposed to the HPHT treatment conditions for 30 seconds or longer. In another embodiment, the lead telluride is exposed to the HPHT treatment conditions for about 5 minutes to about 15 minutes.

Another embodiment includes HPHT-treated high purity semiconductor material that has a Seebeck coefficient that is higher than that of a semiconductor material of the same composition that is not HPHT-treated. In an embodiment, high purity material is greater than or equal to 99.9% (w/w) pure. In another embodiment, high purity material is greater than or equal to 99.99% (w/w) pure. In yet another embodiment, high purity material is greater than or equal to 99.999% (w/w) pure. In embodiments, the starting semiconductor may be a powder, a polycrystalline mass, one or more discrete single crystals, or any combination thereof. The average grain size of the semiconductor starting powder ranges from about 50 μm to about 4000 μm.

In an embodiment, the high purity semiconductor may include one or more selenides, antimonides, tellurides, sulfides, germanium compounds, and/or mixtures thereof. In another embodiment, the high purity semiconductor material may be lead selenide, lead sulfide, lead telluride, bismuth telluride, tin sulfide, tin telluride, lead tin telluride, thallium tin telluride, thallium or germanium telluride, and/or mixtures thereof.

In an exemplary embodiment, the Seebeck coefficient of a high purity semiconductor material may be increased by HPHT-treatment at a pressure ranging from about 1 GPa to about 20 GPa and the temperature from about 500° C. to about 2500° C. for about 5 minutes to about 30 minutes. In another embodiment, the treatment time is about 5 minutes to about 15 minutes.

In an exemplary embodiment, the Seebeck coefficient of a high purity semiconductor material may be increased by HPHT-treatment at a pressure ranging from about 4 GPa to about 8 GPa and a temperature from about 600° C. to about 1300° C. for about 5 minutes to about 15 minutes.

EXAMPLE 1

Lead telluride (PbTe) (99.999% (w/w) purity, Alfa Aesar) was shaped into pellets and loaded into a high pressure cell inside a pressure transmitting medium. Samples were HPHT treated at approximately 6.5 GPa at either 900° C. or 1050° C. for a period of 5 to 15 minutes. The resulting PbTe pills were recovered and cut into ingots about 10 mm×3 mm×3 mm in dimension for Seebeck measurements. The Seebeck measurements were obtained at temperatures ranging from 75 K to 300 K.

Table 1 describes the HPHT treatments applied to the PbTe pills. The average grain size of the semiconductor starting powder from which the pills were pressed is given in the last column. In embodiments, the average particle size of the semiconductor starting powder ranges from about 2 mm to about 4 mm. For other embodiments, the average particle size of the semiconductor starting powder was less than about 0.1 mm. In some embodiments, the average particle size was between about 0.1 mm and 4 mm. The average particle size may be greater than 4 mm. The as received material was cut from a single chunk of PbTe.

TABLE 1

Experimental variables for HPHT-treated PbTe samples

| Sample | Pressure (GPa) | Temperature (° C.) | Time (min) | Powder Size (mm) | Seebeck Coefficient @ 300 K ($\mu$V/K) |
|---|---|---|---|---|---|
| As received | N/A | N/A | N/A | N/A | −232 |
| A | 6.5 | 900 | 5 | 2.0-4.0 | −235 |
| B | 6.5 | 1050 | 15 | 2.0-4.0 | −357 |
| C | 6.5 | 1050 | 5 | 2.0-4.0 | −225 |
| D | 6.5 | 900 | 15 | <0.1 | −309 |
| E | 6.5 | 900 | 5 | <0.1 | −340 |

FIG. 2 depicts the Seebeck coefficient measurements of PbTe samples before (as received) and after HPHT treatment in accordance with Example 1. FIG. 2 illustrates the change in Seebeck coefficient as a result of HPHT treatment. It can be seen that certain parameter changes during HPHT treatment result in a Seebeck coefficient change which persists after exposure to HPHT processes. The as-received sample has a Seebeck coefficient of about −232 $\mu$V/K at 300 K, while sample B shows a Seebeck coefficient value of about 357 $\mu$V/K at 300 K. It is noted that the conditions of HPHT treatment for samples A and C were not adequate to significantly increase the Seebeck coefficient. When comparing A and C with B, it is noted that increasing the time of HPHT treatment from about 5 minutes to 15 minutes results in an increased Seebeck coefficient. Therefore, the length of treatment time influences the Seebeck coefficient. In addition, comparison of A and E shows that the starting powder with an average particle size of about 0.1 mm has a larger increase in Seebeck coefficient than the starting powder with 2-4 mm average particle size, all other conditions being equal.

EXAMPLE 2

Samples of lead telluride were synthesized from high purity lead and tellurium at atmospheric pressure, and then subjected to HPHT conditions. Pressures ranged from about 5 to about 7.5 GPa. The temperatures were either 1050° C. or 1200° C. A treatment time of 10 minutes was used for all samples, and the starting powder had an average particle size of about 0.05 mm to about 0.1 mm. Results for the Seebeck coefficient measured at 300 K are shown in Table 2.

TABLE 2

Effect of increased pressure on the increase of the Seebeck coefficient

| Sample | Pressure (GPa) | Temperature (° C.) | Time (min) | Grain Size (mm) | Seebeck @ 300 K ($\mu$V/K) |
|---|---|---|---|---|---|
| Synthesized | N/A | N/A | N/A | 0.5 | −140 |
| F | 7.5 | 1200 | 10 | 0.05-0.10 | −108 |
| G | 5.0 | 1050 | 10 | 0.05-0.10 | −272 |
| H | 6.5 | 1050 | 10 | 0.05-0.10 | −218 |
| I | 6.5 | 1200 | 10 | 0.05-0.10 | −255 |

Comparison of samples H and I demonstrates that increasing the temperature results in a higher increase of the Seebeck coefficient, in embodiments, the temperature may be increased to just below the melting point of PbTe at an elevated pressure. The melting point of lead telluride is about 917° C. at atmospheric pressure. In embodiments herein, the HPHT treatment may be conducted in the range of about 600° C. to about 1300° C. depending upon the pressure used in the treatment since the melting point is increased at higher pressures. Comparison of samples G and H indicate that lower pressures may be beneficial in increasing the Seebeck coefficient. Comparison of samples F and I indicate that there may be an upper pressure limit where an increase in the Seebeck coefficient is not observed.

This data demonstrates that there is an optimum time, temperature, and pressure leading to a maximum absolute value for the Seebeck coefficient. In addition, the data further demonstrates that particle size has an effect on the degree of increase of the Seebeck coefficient.

These results are not intended to be limiting. Other thermoelectric materials, different treatment conditions, microstructural modifications, and measurements at different temperatures may show greater improvement in the Seebeck coefficient. Other thermoelectric materials, other materials properties, other microstructures, and other HPHT processing conditions are all included in the scope of the embodiments and claims herein.

It will be appreciated that variations of the above-disclosed and other features and functions, or alternatives thereof, may be desirably combined into many other different systems or applications. Also, that various presently unforeseen or unanticipated alternatives, modifications, variations or improvements therein, may be subsequently made by those skilled in the art which are also intended to be encompassed by the following embodiments.

What is claimed is:

1. A method of increasing the Seebeck coefficient of a semiconductor, comprising:
    loading a semiconductor compound into a reaction cell;
    exposing the semiconductor compound to a pressure in a range of 1 GPa to 20 GPa and an elevated temperature in a range of 500° C. to about 2500° C. for a time sufficient to increase the Seebeck coefficient of the semiconductor compound, wherein the semiconductor compound is selected from the group consisting of selenides, antimonides, tellurides, sulfides, germanium compounds, and mixtures thereof; and
    recovering the semiconductor with an increased Seebeck coefficient.

2. The method of claim 1, wherein the pressure ranges from about 2 GPa to about 10 GPa.

3. The method of claim 1, wherein the pressure ranges from about 4 GPa to about 8 GPa.

4. The method of claim 1, wherein the temperature ranges from about a sintering temperature of the semiconductor to about 500° C. above a melting point of the semiconductor at process pressures.

5. The method of claim 1, wherein the temperature compound ranges from a sintering temperature of the semiconductor to about a melting point of the semiconductor at process pressures.

6. The method of claim 1, wherein the semiconductor compound is selected from the group consisting of lead selenide, lead sulfide, lead telluride, tin sulfide, tin telluride, and mixtures thereof.

7. The method of claim 1, wherein the semiconductor comprises lead telluride.

8. The method of claim 1, wherein the time is from about 30 seconds to about 24 hours.

9. The method of claim 1, wherein the semiconductor further comprises dopants.

10. The method of claim 1, wherein the time is about 5 minutes to about 30 minutes.

11. The method of claim 1, wherein the semiconductor comprises a semiconductor starting powder, wherein the semiconductor starting powder has an average particle size of about 0.5 mm to about 4 mm.

12. The method of claim 1, wherein prior to exposing the semiconductor to elevated pressure and elevated temperature, the semiconductor comprises a powder, a polycrystalline mass, one or more discrete single crystals, or a combination thereof.

13. A method for increasing the Seebeck coefficient of lead telluride, comprising:
    loading lead telluride compound into a reaction cell;
    exposing the reaction cell to a pressure ranging from about 4 GPa to about 8 GPa and a temperature from about 600° C. to about 1300° C. for a time sufficient to increase the Seebeck coefficient of the lead telluride; and
    recovering the lead telluride with an increased Seebeck coefficient.

14. The method of claim 13, wherein the time is about 5 minutes to about 24 hours.

15. The method of claim 13, wherein the lead telluride comprises a lead telluride starting powder having an average particle size of about 0.5 mm to about 4 mm.

16. An HPHT-treated high purity semiconductor compound, having a Seebeck coefficient that is higher than a semiconductor material of the same composition that is not HPHT-treated, wherein the semiconductor material is selected from the group consisting of selenides, antimonides, tellurides, sulfides, germanium compounds, and mixtures thereof.

17. The semiconductor material of claim 16, wherein the semiconductor material is selected from the group consisting of lead selenide, lead sulfide, lead telluride, tin sulfide, tin telluride, and mixtures thereof.

18. A method for increasing the Seebeck coefficient of a semiconductor, comprising:
    loading a high purity semiconductor compound into a reaction cell;
    exposing the semiconductor compound to a pressure ranging from about 4 GPa to about 8 GPa and a temperature from about 1000° C. to about 2500° C. for a time sufficient to increase the Seebeck coefficient of the semiconductor; and
    recovering the semiconductor compound with an increased Seebeck coefficient.

19. The method of claim 18, wherein said temperature is about 1050° C.

20. The method of claim 18, wherein said temperature is about 1200° C.

21. The method of claim 18, wherein said time is about 10 minutes.

\* \* \* \* \*